US007989025B2

(12) United States Patent
Sakai et al.

(10) Patent No.: US 7,989,025 B2
(45) Date of Patent: Aug. 2, 2011

(54) FILM FORMING METHOD, METHOD FOR MANUFACTURING ORGANIC ELECTROLUMINESCENT DEVICE, ORGANIC ELECTROLUMINESCENT DEVICE, AND ELECTRONIC APPARATUS

(75) Inventors: Hirofumi Sakai, Suwa (JP); Takaya Tanaka, Suwa (JP)

(73) Assignee: Seiko Epson Corporation (JP)

( * ) Notice: Subject to any disclaimer, the term of this patent is extended or adjusted under 35 U.S.C. 154(b) by 1045 days.

(21) Appl. No.: 11/535,705

(22) Filed: Sep. 27, 2006

(65) Prior Publication Data
US 2007/0072004 A1  Mar. 29, 2007

(30) Foreign Application Priority Data

Sep. 28, 2005  (JP) ................................. 2005-281510

(51) Int. Cl.
*B05D 5/00* (2006.01)
(52) U.S. Cl. ......... 427/256; 264/101; 264/236; 264/319
(58) Field of Classification Search .................. 427/256; 264/101, 236, 319
See application file for complete search history.

(56) References Cited

U.S. PATENT DOCUMENTS

| 6,878,312 B1 | 4/2005 | Kanbe et al. |
| 6,994,893 B2 | 2/2006 | Spreitzer et al. |
| 2003/0175414 A1* | 9/2003 | Hayashi .......................... 427/66 |
| 2006/0046062 A1* | 3/2006 | Nishigaki et al. ........... 428/411.1 |

FOREIGN PATENT DOCUMENTS

| JP | 50-080337 | 11/1973 |
| JP | 2004-127897 | 4/2004 |
| JP | 2004-535653 | 11/2004 |
| JP | 2004-349064 | 12/2004 |
| JP | 2005-172316 | 6/2005 |
| WO | 00/59267 | 10/2000 |

\* cited by examiner

*Primary Examiner* — Michael Kornakov
*Assistant Examiner* — Xiao Zhao
(74) *Attorney, Agent, or Firm* — Harness, Dickey & Pierce, P.L.C.

(57) ABSTRACT

A film forming method for forming a film including arranging a liquid composition on a substrate and drying the liquid composition, the liquid composition being obtained by dissolving a functional material in a solvent with a plurality of species of liquid mixed therein, is provided. The method includes:
a) firstly reducing a pressure surrounding the liquid composition arranged on the substrate at a first depressurizing speed;
b) increasing the pressure surrounding the liquid composition to a predetermined pressures after the step a); and
c) secondly reducing the pressure surrounding the liquid composition at a second depressurizing speed, after the step b).

12 Claims, 12 Drawing Sheets

FILM FORMING METHOD, METHOD FOR MANUFACTURING ORGANIC ELECTROLUMINESCENT DEVICE, ORGANIC ELECTROLUMINESCENT DEVICE, AND ELECTRONIC APPARATUS

BACKGROUND OF THE INVENTION

1. Technical Field

The present invention relates to a film forming method, a method for manufacturing an organic electroluminescent device, an organic electroluminescent device, and an electronic apparatus.

2. Related Art

When forming a film such as a light-emitting layer of, for example, an organic electroluminescent device (hereinafter also referred to as an organic EL device), there is used a technique in which on a substrate ink, that is obtained by dissolving in a solvent composed of a plurality of species of liquid mixed with each other a functional material that forms a light-emitting layer, is applied and then dried, thereby forming a film.

There are mainly two functions which are demanded of the ink. One function is capability to be applied on the substrate, and the other is ability to form a flat film. It is very difficult for solvent with a single component to fulfill those two functions. Therefore, there is often used, for example, ink composed of a plurality of species of solvent mixed with each other (see, for example, JP-A-2004-535653). Further, when drying the ink, the pressure surrounding the ink is reduced from a normal atmosphere pressure to 3-10 Pa at a constant speed, thereby allowing the solvent to evaporate (see, for example, JP-A-2004-127897).

As shown in FIG. 15, when drying the ink applied, the evaporation rate of the solvent is higher in a central part of the ink 150 than in the peripheral part thereof. Note that FIGS. 15 and 16 each show a view illustrating a step for forming a hole injection layer of an organic EL device. Reference symbols 131, 135 and 136 respectively denote an anode of the organic EL device, a pixel aperture film, and a partition. The flow of the solvent from the central part flows towards the peripheral part of the ink 150 so as to replace the reduced solvent which has evaporated (the flow is indicated by solid arrows in the ink). It is known that the flow rate at this time is proportionate to the difference between the evaporation amount of the central part and the evaporation amount of the peripheral part. Due to this flow of the solvent, solute in the ink flows from the central part towards the peripheral part and remains there. Accordingly, there occurs a concentration gradient between the central part and the peripheral part of the ink. On the other hand, the solute tends to diffuse in the entire ink so as to eliminate the concentration gradient (this tendency is indicated by open arrows in the ink). In this way, in the ink, there is observed an equilibrium state between the solute moving in accordance with the flow of the solvent and the solute tending to diffuse.

JP-A-2004-535653 and JP-A-2004-127897 are examples of related art.

As the evaporation takes place more vigorously upon dying under reduced pressure, however, the difference in the evaporation amount between the central part and the peripheral part of the ink becomes larger. Accordingly, the flow of the solvent becomes dominant over the diffusion of the solute, thereby making it impossible for the solute to diffuse in the entire ink. As a result, the solute stacks in the peripheral part, so there arises a problem in that after evaporation of the solute, only such a film (for example, the hole injection layer) 132 can be obtained that the central part is thinner and the peripheral part is thicker, as shown in FIG. 16. On the other hand, when the drying speed is reduced, it takes much time to perform drying, which disadvantageously reduces the throughput.

SUMMARY

An advantage of the present invention is to provide a film forming method capable of obtaining a flat film, a method for manufacturing an organic electroluminescent device, an organic electroluminescent device and an electronic apparatus.

One aspect of the invention is a film forming method for forming a film including arranging a liquid composition on a substrate and drying the liquid composition, the liquid composition being obtained by dissolving a functional material in a solvent with a plurality of species of liquid mixed therein. The method includes: a first depressurizing process in which a pressure surrounding the liquid composition arranged on the substrate is reduced at a first depressurizing speed; a pressurizing process in which the pressure surrounding the liquid composition is increased to a predetermined pressure, after the first depressurizing process; and a second depressurizing process in which the pressure surrounding the liquid composition is reduced at a second depressurizing speed, after the pressurizing process.

In this case, the evaporation rate of the entire solvent is decreased by increasing the pressure surrounding the liquid composition to the predetermined pressure in the pressurizing process. In other words, not only the evaporation amount ($J_E$) of the solvent of the central part in the liquid composition but also the evaporation amount ($J_C$) of the solvent of the peripheral part in the liquid composition is decreased. Accordingly, the difference between $J_E$ and $J_C$ becomes smaller, thereby reducing also the flow rate of the solvent moving from the central part towards the peripheral part in the liquid composition. As the flow rate of the solvent is thus reduced, the solute diffuses in the liquid composition. Therefore, the concentration of the solute is constant in the central part and the peripheral part of the liquid composition. The second depressurizing process is performed with the concentration of the solute being constant, thereby making it possible to obtain a flat film. It should be noted that "the predetermined pressure" means the pressure capable of reducing the evaporation speed of the entire solvent and is preferably an atmosphere pressure, for example.

Further, it is preferable that the pressurizing process further include supplying inert gas around the liquid composition.

In this case, it is possible to prevent the liquid composition from deteriorating since inert gas is supplied around the liquid composition. It should be noted that as inert gas nitrogen gas or argon gas, for example, is preferably used.

Furthermore, it is preferable that the pressurizing process further include supplying vapor of the solvent around the liquid composition.

In this case, it is possible to prevent the liquid composition from deteriorating and further reliably reduce the evaporation amount of the solvent since vapor of the solvent is supplied around the liquid composition.

Moreover, it is preferable that applying the liquid composition be performed by an ink jet method.

In this case, it is possible to enhance the coating property of the liquid composition since the liquid composition is applied by an ink jet method. As a result, it is possible to provide surroundings in which the film thickness can be easily made to be even in the drying process.

According to a second aspect of the invention, an organic electroluminescent device is manufactured by the above-mentioned method for manufacturing an organic electroluminescent device.

In this case, it is possible to obtain an organic electroluminescent device having no chrominance non-uniformity since a charge transport layer and a light emitting layer having a uniform film thickness are formed.

According to a third aspect of the invention, an electronic apparatus includes an organic electroluminescent device.

In this case, it is possible to obtain an electronic apparatus capable of realizing satisfactory display since the electronic apparatus includes an organic electroluminescent device having no variation in display.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a first embodiment of the invention will be described with reference to the drawings.

Organic EL Device

Figure 1:
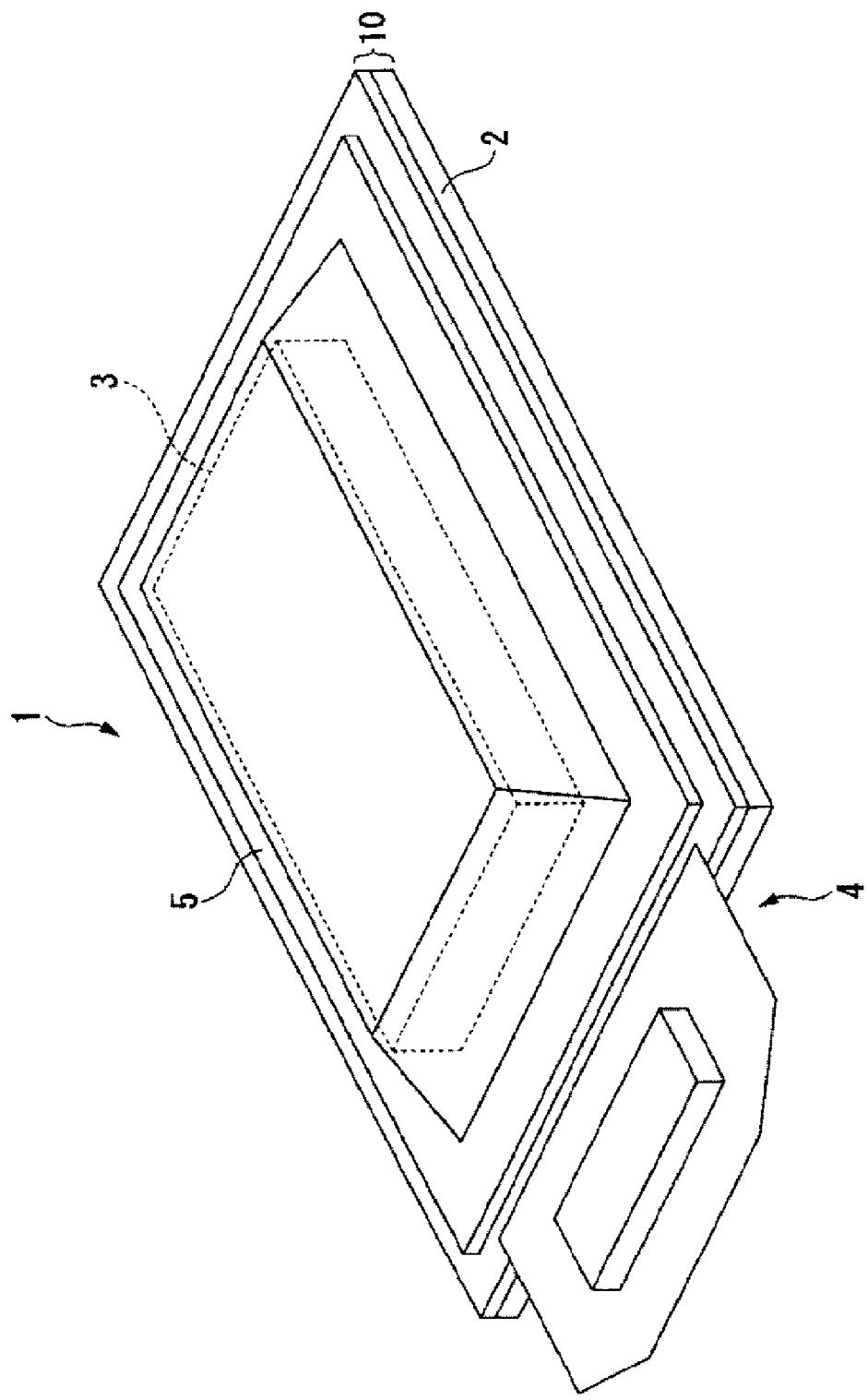
FIG. 1 is a view showing the entire construction of an organic EL device according to a first embodiment of the invention.

FIG. 1 is a perspective view schematically showing the entire construction of an organic EL device 1. In the following figures, the scale is changed as appropriate so that each part is large enough to be recognized.

The organic EL device 1 has a base 10 composed of a substrate 2 with wires, insulating layers or the like being formed thereon, an organic EL element part 3 formed on the base 10, a driving part 4 attached to an end 2a of the base 10, and a sealing member 5 that covers the organic EL element part 3 and the base 10. The organic EL element part 3 emits light depending on signals supplied from the driving part 4, thereby making it possible to display images, moving images or the like. As to this embodiment, there is described as an example the organic EL device 1 of the active matrix type with a Thin Film Transistor (TFT) formed therein and of the bottom emission type in which light emitted by the organic EL element part 3 is transmitted through the base 10 to be extracted therefrom.

Figure 2:
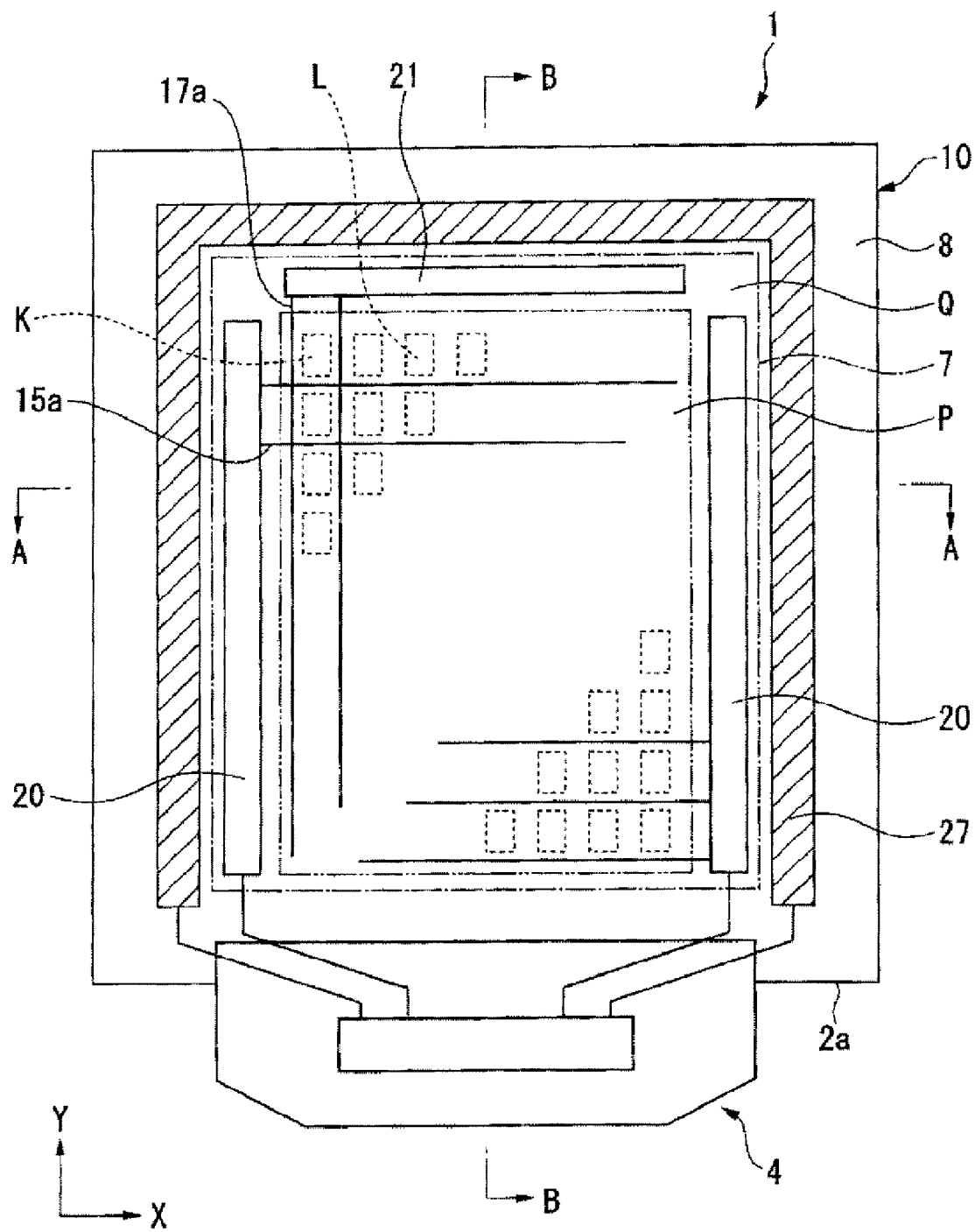
FIG. 2 is a plan view showing the construction of the organic EL device according to the first embodiment of the invention.

FIG. 2 is a plan view of the organic EL device 1. In this figure, the organic EL element part 3 and the sealing member 5 are not shown.

As shown in FIG. 2, the base 10 is divided into a pixel part 7 (region surrounded by alternate long and short dashed lines) and a peripheral part 8 (region outside the region indicated by those alternate long and short dashed lines). The pixel part 7 is subdivided into an actual display region P (region surrounded by a chain double-dashed line) and a dummy region Q (region between the alternate long and short dashed lines and the chain double-dashed line). In the actual display region P of the pixel part 7, a pixel region K, through which light from a light emitting region 14 is passed, is arranged in a matrix-like manner. As shown in the FIG. 2, in the region between the pixel regions K, there are formed scanning lines 15a extending in the X direction and data lines 17a extending in the Y direction.

Figure 3:
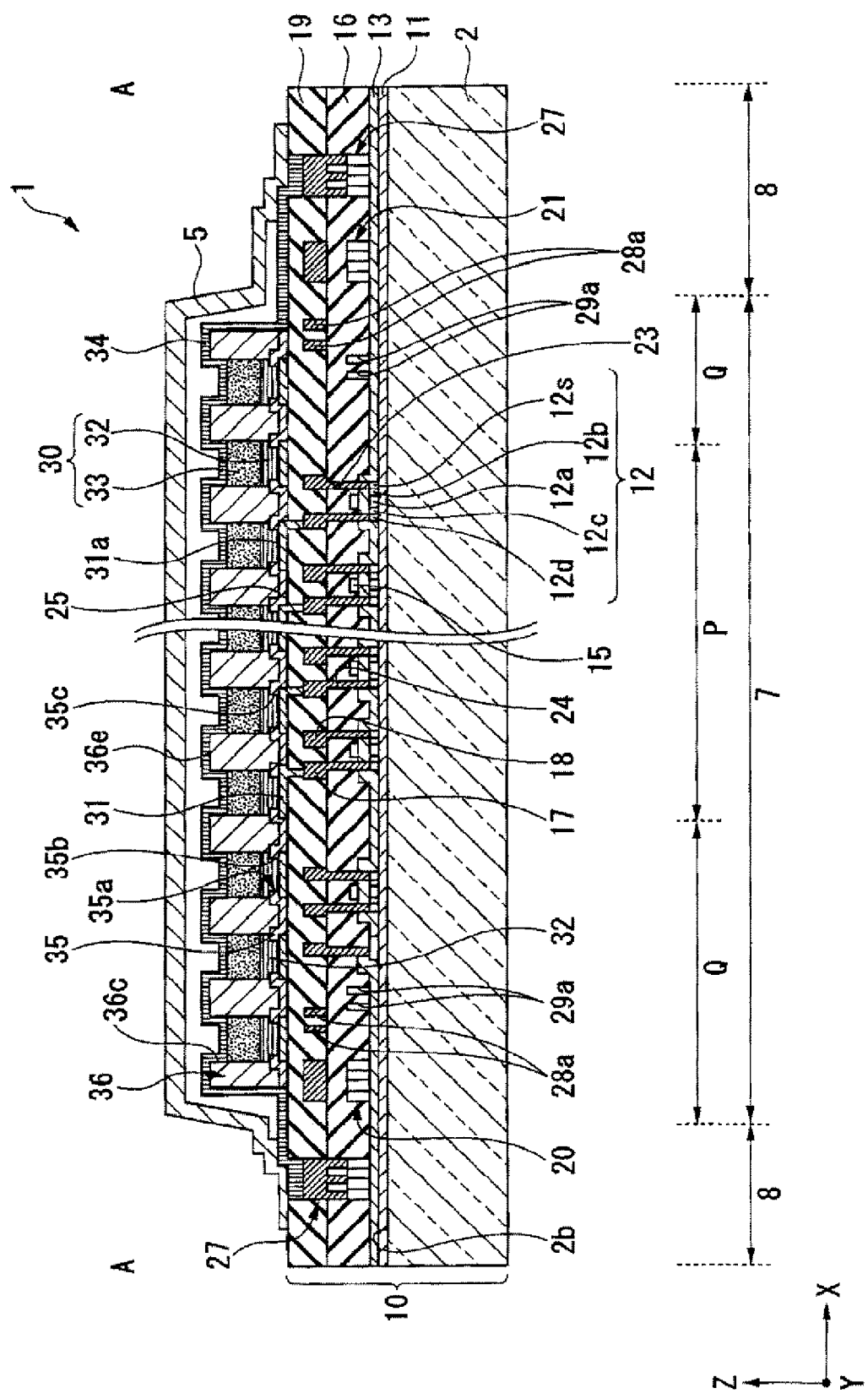
FIG. 3 is a cross sectional view showing the construction of the organic EL device according to the first embodiment of the invention.
Figure 4:
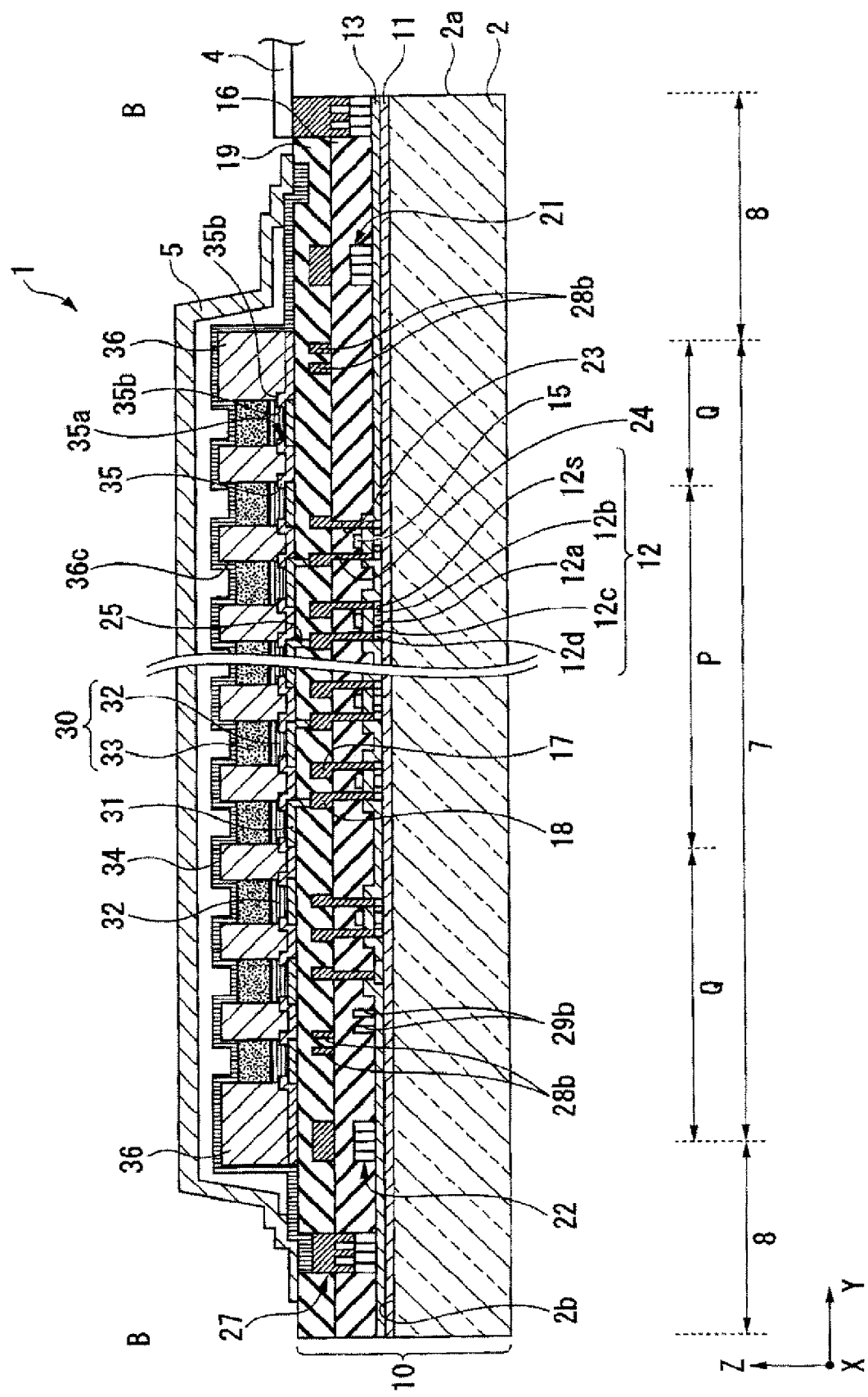
FIG. 4 is a cross sectional view showing the construction of the organic EL device according to the first embodiment of the invention similar to FIG. 3.

FIG. 3 is a schematic cross sectional view taken along the line A-A of the organic EL device 1 of FIG. 2. FIG. 4 is a schematic cross sectional view taken along the line B-B of the organic EL device 1 of FIG. 2.

As shown in FIGS. 3 and 4, the substrate 2, which is a component of the base 10, is a transparent substrate composed of glass, quartz, resin (plastic or plastic film) or the like. The organic EL device 1 according to this embodiment is of the bottom emission type. Therefore, the substrate 2 must be transparent so that light can be extracted therefrom. On a surface 2b of the substrate 2, there is formed as a foundation a transparent foundation protecting layer 11 composed of, for example, $SiO_2$.

In the actual display region P of the pixel part 7, there are formed, on the foundation protecting layer 11, a silicon film 12, a first insulating layer (gate insulating layer) 13, a gate electrode 15, a second insulating layer 16, a source electrode 17, a drain electrode 18, and a third insulating layer 19. Further, in the dummy region Q of the pixel part 7, there are formed, on the foundation protecting layer 11, a scanning drive circuit 20, a data drive circuit 21 and the like. Furthermore, there is formed a power wire (not shown) to be connected to the driving part 4.

The silicon film 12 is a driver transistor, which has a channel region, a source region and a drain region. Of the silicon film 12, a region that overlaps the gate electrode 15 with the gate insulating layer 13 being sandwiched therebetween is a channel region 12a. On the source side of the channel region 12a, there are formed a low concentration source region 12b and a high concentration source region 12s. On the drain side of the channel region 12a, there are formed a low concentration drain region 12c and a high concentration drain region 12d. As described above, the silicon film 12 has a Lightly Doped Drain (LDD) structure.

In the high concentration source region 12s and the high concentration source region 12d, there are formed contact holes 23 and 24 passing through the gate insulating layer 13 and the second insulating layer 16 continuously to thereby open at the same. On the other hand, on the high concentration drain region 12d side, there is formed a contact hole 25 passing though the third insulating layer 19 so as to be connected to the drain electrode 18.

The gate insulating layer 13 is a transparent layer composed of $SiO_2$, SiN or the like, and insulates the silicon film 12 from the gate electrode 15.

The gate electrode 15 is composed of aluminum, copper or the like, and is connected to the scanning lines 15a. The source electrode 17 is composed of aluminum, copper or the like, as is the case with the gate electrode 15, and is connected to the data lines 17a. The source electrode 17 is connected to the high concentration source region 12s via the contact hole 23. Further, the drain electrode 18 is connected to the high concentration drain region 12d.

The second insulating layer 16 is a transparent layer mainly composed of $SiO_2$. The gate electrode 15, the source electrode 17 and the drain electrode 18 are respectively insulated from each other by the second insulating layer 16.

The third insulating layer 19 is mainly composed oft for example, an acrylic resin component, and insulates the source electrode 17 from the drain electrode 18 and the contact hole 25. It should be noted that materials other than an acrylic resin component such as SiN, SiO2, or the like may be used for the insulating layer.

Further, the scanning drive circuit 20 provided in the dummy region Q has a memory such as a shift resistor, a circuit such as a level shifter that converts a signal level, etc., and is connected to the scanning lines 15a.

The data drive circuit 21 has, apart from the shift resistor and the level shifter, circuits such as a video line, an analog shifter or the like, and is connected to the data lines 17a. The scanning drive circuit 20 and the data drive circuit 21 are connected to the driving part 4 via driving control signal lines 28a and 28b, and output an electric signal to the scanning lines 15a and the data lines 17a through controlling of the driving part 4. The scanning drive circuit 20 and the data drive circuit 21 are connected to a power source via driving power lines 29a and 29b.

In the peripheral part 8, there is formed a connecting wiring 27 to be connected to the organic EL element 3. The connecting wiring 27 is connected to the driving part 4, thereby making it possible to supply an electric signal from the driving part 4 to the organic EL element 3 via the connecting wiring 27.

On the other hand, the organic EL element 3 has an anode 31, a hole injection layer 32, a light emitting layer 33, a common electrode (cathode) 34, a pixel aperture film 35, and a partition 36, all of which are stacked on the base 10 described above.

The anode 31 is a transparent electrode making it possible to inject holes into the hole injection layer 32, and is composed of Indium Tin Oxide (ITO) or the like. The anode 31 is connected to the drain electrode 18 via the contact hole 25, and is formed to have a convex-shape so as to press the hole injection layer 32. The hole injection layer 32 is composed of materials such as a 3,4-polyethylene-dioxy-thiophene/polystyrenesulfonate (PEDOT/PSS) which is a polyolefin derivative.

The light emitting layer 33 is a layer that emits light when holes from the hole injection layer 32 and electrons from the cathode 34 are coupled with each other. It is preferable that high polymer materials having more than 1000 molecular weight be used for this light emitting layer 33. To be more specific, there are used a polyfluorene derivative, a polyphenylene derivative, polyvinylcarbazole, a polythiophene derivative, or high polymer materials thereof doped with perylene dye, coumarin dye, rhodamine dye such as rubrene, perylene, 9,10-diphenylanthoracene, tetraphenyl butadiene, nile red, coumarin 6, quinacridone etc.

In the light emitting layer 33, there are included three kinds of layers: a layer emitting red light (33R), a layer emitting green light (33G), and a layer emitting blue light (33B). Light from such the light emitting layer 33 is transmitted through the hole injection layer 32, the anode 31 and the base 10, thereby allowing images, moving images or the like to be displayed on the actual display region P of the substrate 2.

The cathode 34 is a layer through which electrons are injected into the light emitting layer 33 depending on an electric signal from the driving part 4. The cathode 34 is formed of metal such as calcium. The cathode 34 has a lager area than the total area of the actual display region P and the dummy region Q, thereby covering those regions. The cathode 34 is formed on the base 10 in the state in which the cathode 34 covers the outside of the organic EL element 3. The cathode 34 is connected to the connecting wiring 27 and further to the driving part 4 via this connecting wiring 27. For the purpose of avoiding corrosion of the cathode 34 at manufacturing, there may be formed, on the upper layer portion of the cathode 34, a protecting layer composed of, for example, such as aluminum.

The pixel aperture film 35 is an insulating film composed of, for example, $SiO_2$. The pixel aperture film 35 enables the movement of holes from the anode 31 at the aperture portion 35a surrounded by the wall surface 35b, and prevents holes from moving at sites where no aperture portion 35a is provided.

The partition 36 is a member that separates the pixels from one another at the time of forming the hole injection layer 32, the light emitting layer 33 or the like by a liquid droplet discharging method such as an ink jet method. Further, the partition 36 is an insulating member that prevents electrons from being transferred between the hole injection layer 32 and the light emitting layer 33 which are adjacent to each other. The partition 36 is formed of materials having heat resistance and solvent resistance such as acryl or polyimide, and separates the respective hole injection layers 32 from the respective light emitting layers 33. In the partition 36, there are formed a region exhibits lyophilic properties and a region exhibits liquid-repellent properties.

Drying Apparatus

Next, a drying apparatus that dries liquid droplets of the hole injection layer 32 and the light emitting layer 33 formed by a liquid droplet discharging method.

Figure 5:
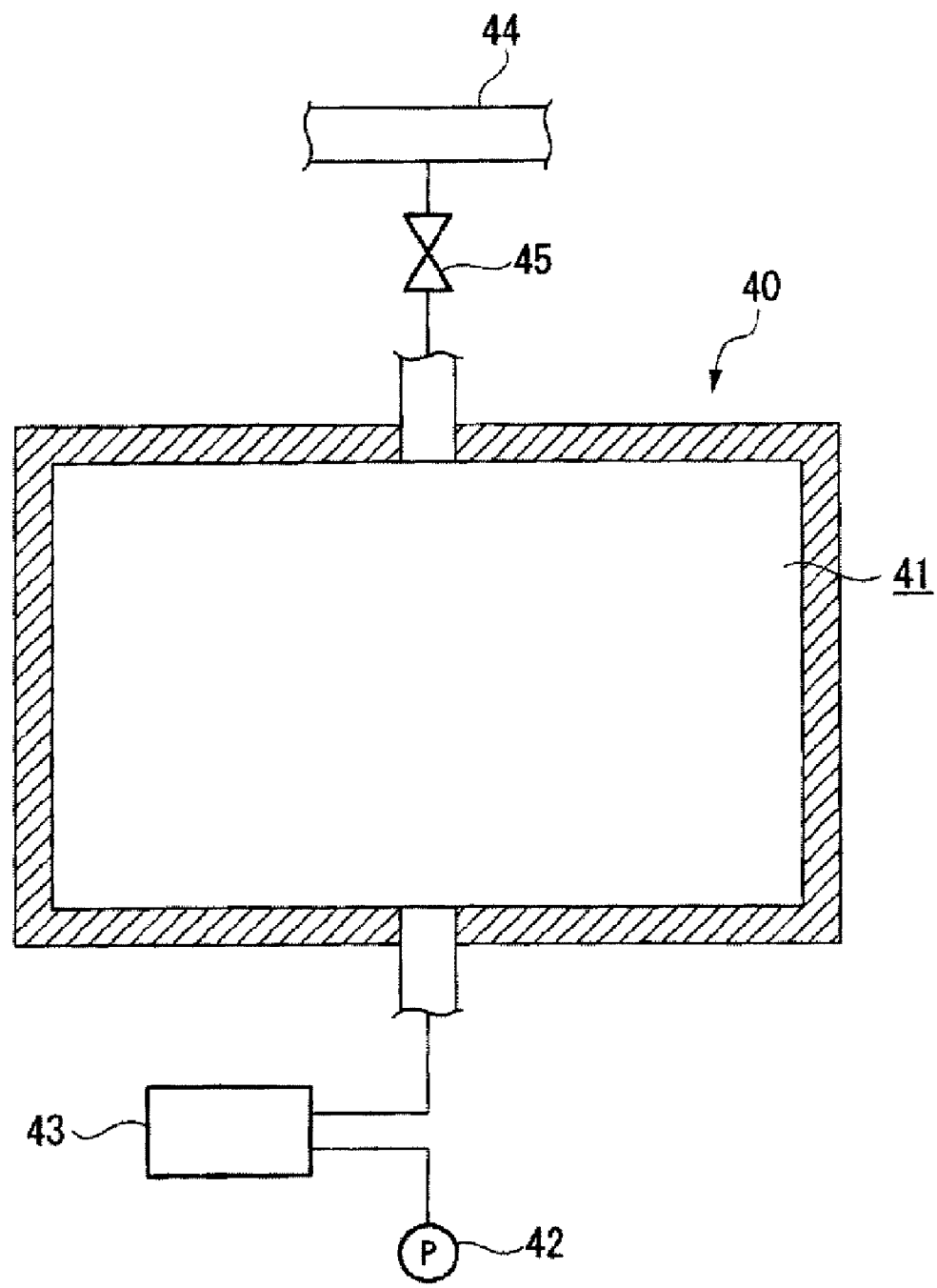
FIG. 5 is a view showing the construction of a drying apparatus that performs drying step according to the first embodiment of the invention.

FIG. 5 is a schematic view showing the construction of the drying apparatus 40.

As shown in FIG. 5, the drying apparatus 40 includes an airtight treatment room 41, an exhaust apparatus (for example, pump) 42 that reduces the pressure in the treatment room 41, a trap 43 that adjusts the conduction of the exhaust air of the treatment room 41, and a gas supply source 44 that supplies inert gas such as nitrogen gas into the treatment room 41, a valve 45 that adjusts a flow rate of gas supplied to the treatment room 41. For the gas supply source 44, for example, a nitrogen gas line of a factory can be used. There is also provided, inside the treatment room 41, a holding portion (not shown) that holds the base 10.

Method for Manufacturing Organic EL Device

Next, steps for manufacturing the organic EL device 1 constructed as described above will be described. Hereinafter, the step for forming the base 10 and a region of the pixel part 7 of the organic EL element 3 is mainly described, and the description of the step for forming the peripheral part 8 is omitted, When forming the hole injection layer 32 and the light emitting layer 33 according to this embodiment, there is performed an ink jet method in which the materials of the hole injection layer 32 and those of the light emitting layer 33 are dissolved in solvent, and then made to drop onto predetermined places.

First, the step for forming the base 10 by forming a TFT element, an insulating film or the like on the substrate 2 will be described.

According to a known method, the foundation protecting layer 11 is formed on the substrate 2. The silicon film 12 is formed on the foundation protecting layer 11, and then subject to laser annealing to be polysiliconized. After the silicon film 12 thus polysiliconized is covered with the gate insulating layer 13, the gate electrode 15 is formed thereon, and then the gate insulating layer 13 is formed thereon again. Further, the contact hole 32 on the source side is formed by patterning.

After that, the second insulating layer 16 is formed, and the contact hole 24 and the source electrode 17 connected to the contact hole 24 are formed by patterning. On the second insulating layer 16, there are formed the source electrode 17 and the drain electrode 18 by patterning. On the source electrode 17 and the drain electrode 18, there is formed the third insulating layer 19, and the contact hole 25 on the drain side is formed by patterning.

In that way, the base 10 is formed.

Next, the step for forming the organic EL element 3 will be described.

A transparent conducting layer is formed so as to cover substantially the entire surface of the base 10, and is subjected to patterning so that the anode 31 is formed in the predetermined region. At the same time, the dummy pattern (not shown) of the dummy region Q is also formed. The contact hole 25 and the anode 31 are connected to each other in the pixel region K, thereby conducting the anode 31 and the drain electrode 18.

Then, the pixel aperture film 35 is formed on the third insulating layer 19. The pixel aperture film 35 is so formed that the pixel aperture film 35 is stacked on, for example, the anode 31, thereby allowing the aperture portion 35a surrounded by the wall surface 35b to be formed. Further, the partition 36 is formed on the pixel aperture film 35. Resists obtained by dissolving in solvent materials composed of resins such as acryl resin or polyimide resin are coated according to various methods such as a spin coat method or a dip coat method, thereby forming a resist layer, which is then subjected to patterning according to, for example, a photo lithography technique so that the aperture portion 35a is formed in the predetermined pattern.

After that, the entire surface of the pixel aperture film 35 is heated to, for example, about 70-80° C. and then subjected to plasma treatment. By performing $O_2$ plasma treatment using oxygen as reaction gas under atmosphere, a wall surface 36c of the partition 36, an upper surface 31a of the anode 31 and an upper surface 35c of the pixel aperture film 35 (see FIG. 3) become lyophilic. Further, by performing $CF_4$ plasma treatment using methane tetrafluoride as reaction gas under atmosphere, an upper surface 36e and the wall surface 36c of the partition 36 become liquid-repellent. After that, each part is cooled down to room temperature.

Next, the hole injection layer 32 and the light emitting layer 33 are formed. In the steps for forming those layers, liquid droplets are discharged to the region surrounded by the partition 36 by, for instance, an ink jet method, and then dried to thereby form films in the region surrounded by the partition 36.

Figure 6:
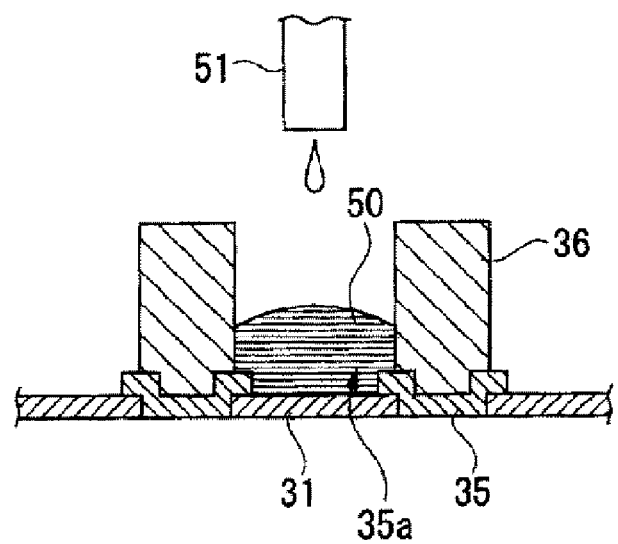
FIG. 6 is a view illustrating a manufacturing step of the organic EL device.

First, the step for forming the hole injection layer 32 will be described. Liquid droplets discharged in this step are ink obtained by dissolving the above-mentioned hole injection materials in mixed solvent obtained composed of, for example, ethylene glycol and water mixed with each other. As shown in FIG. 6, when the ink 50 is discharged from a nozzle 51 to the partition 36, the ink 50 spreads over the anode 31 to which lyophilicity imparting treatment has been performed, thereby filling inside of the aperture portion 35a. On the other hand, liquid droplets are repelled from the upper surface of the partition 36 to which liquid-repellent property imparting treatment has been performed, so the liquid droplets do not adhere thereon.

Figure 7:
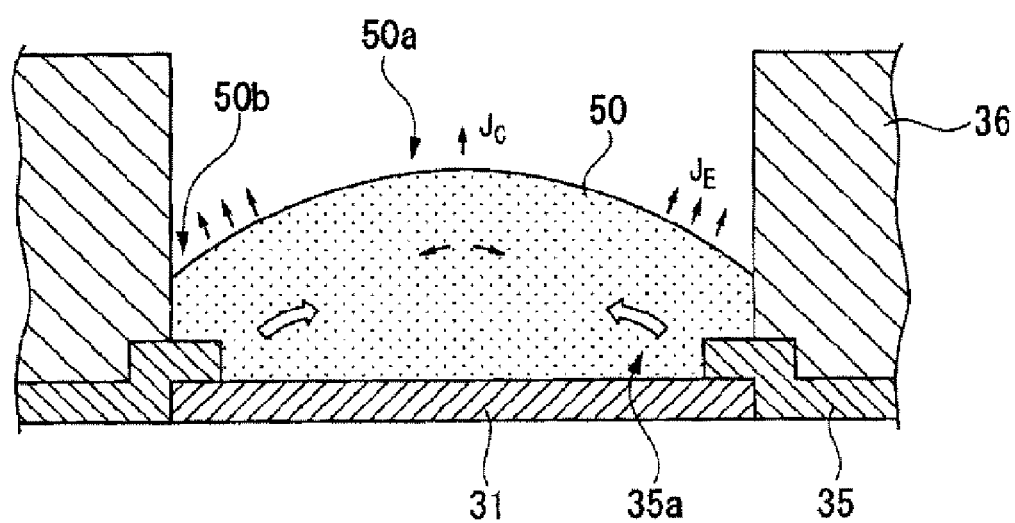
FIG. 7 is a view illustrating another manufacturing step similar to FIG. 6.

FIG. 7 is a view schematically showing the state of solvent and a solute in the ink 50 in the state in which the ink 50 is coated.

In the state in which the ink 50 is coated, mixed solvent evaporates, although in a small amount, into the atmosphere. The evaporation speed of the mixed solvent is higher in a peripheral part 50b of the ink 50 than in a central part 50a of the ink 50. Therefore, the mixed solvent evaporates more in the peripheral part 50b of the ink 50. In the ink 50 coated, there occurs a flow of the mixed solvent from the central part 50a towards the peripheral part 50b so as to replace the evaporated mixed solvent (In FIG. 7, this flow is indicated by solid arrows. The same goes for FIGS. 9, 10, and 11.). The flow rate in this case is proportionate to the absolute value of difference $|J_E-J_C|$ between the evaporation amount $J_c$ of the mixed solvent at the central part 50a and the evaporation amount $J_E$ of the mixed solvent at the peripheral part 50b. The solute is get involved into this flow of the mixed solvent, and moves from the central part 50a towards the peripheral part 50b.

On the other hand, the solute tends to diffuse in the entire ink 50, so the solute tends to move from the peripheral part 50b towards the central part 50a (In FIG. 7, this tendency is indicated by open arrows. The same goes for FIGS. 9, 10, and 11). In the state in which the ink 50 is coated, the solute which is get involved into the flow of the mixed solvent is less in amount than the solute which moves upon diffusing. Therefore, the concentration of the solute in the ink 50 is substantially constant at the central part 50a and the peripheral part 50b.

Figure 8:
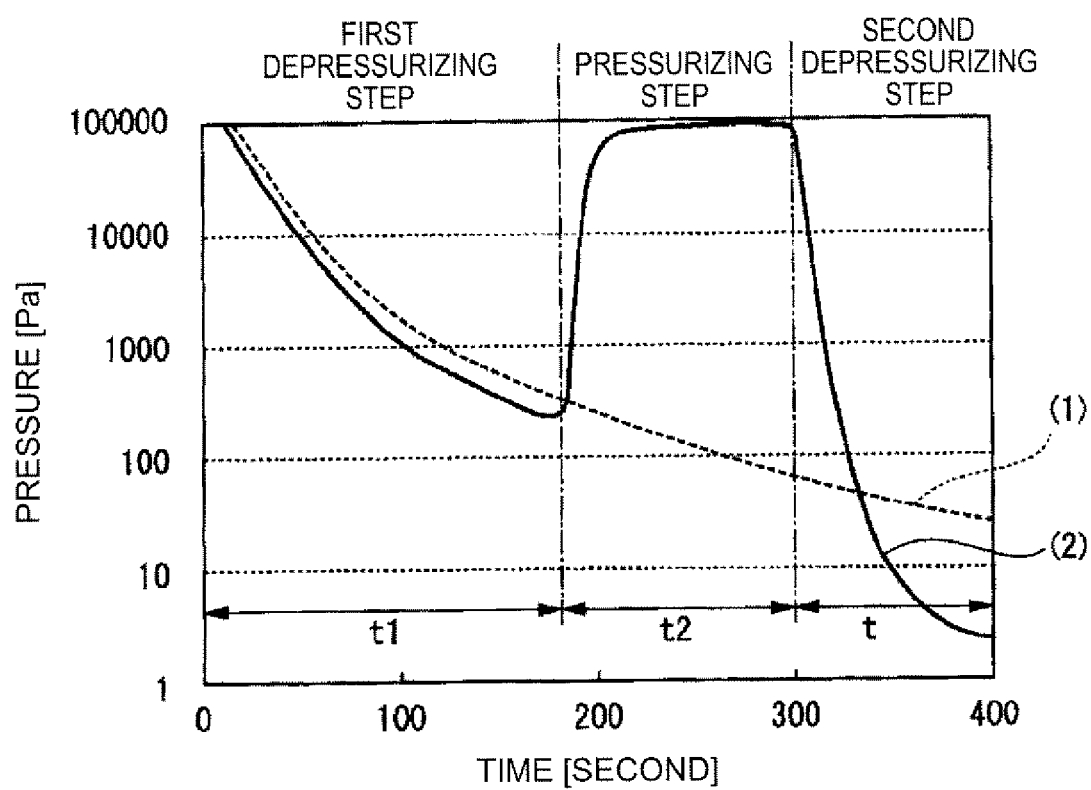
FIG. 8 is a graph showing the change of pressure surrounding the ink.

Then, the pressure surrounding the ink 50 is reduced to thereby dry the ink 50. In the following, the step for drying the ink 50 will be described in detail. FIG. 8 is a graph showing the change of pressure surrounding the ink 50. In this graph, the vertical axis represents pressure and the horizontal axis represents time elapsed after the beginning of drying. It should be noted that the scale of the vertical axis in the graph is logarithmic. In the graph, the broken line (1) represents the change of pressure when the mixed solvent is depressurized at a constant depressurizing speed, and the solid line (2) represents the change of pressure in the case of the present invention.

As indicated by the solid line (2), first, air around the ink 50 is exhausted at a room temperature (for example, at about 20° C.) at a first depressurizing speed, specifically, to about 300 Pa in the course of an exhaustion time t1 (t1 is, for example, 180 seconds), thereby reducing the pressure surrounding the ink 50 (first depressurizing step).

Figure 9:
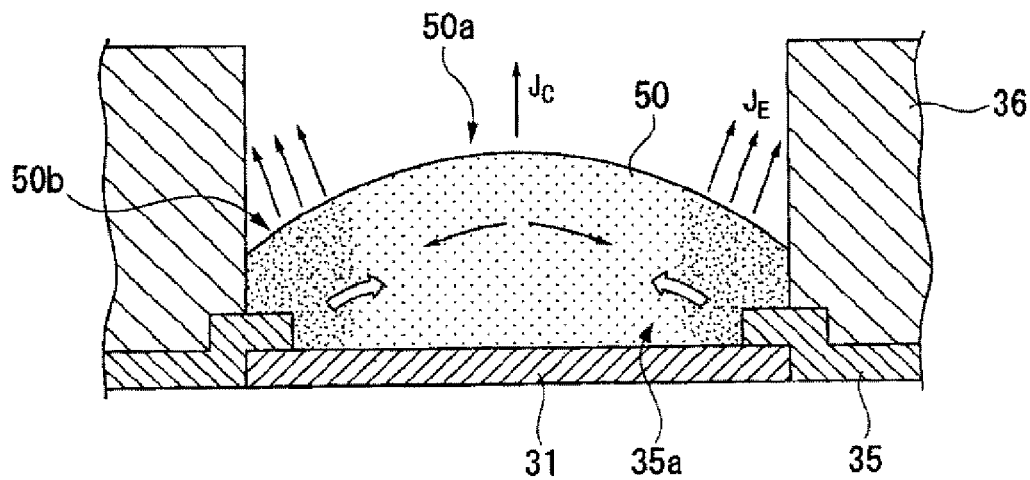
FIG. 9 is a view illustrating another manufacturing step similar to FIG. 6.

As shown in FIG. 9, in the first depressurizing step, a part of the mixed solvent contained in the ink 50 evaporates. In this first depressurizing step, the amount of the mixed solvent evaporating from the central part 50a and the peripheral part 50b of the ink 50 is larger than that before depressurization. Therefore, the value $|J_E-J_C|$ becomes larger. The larger the value $|J_E-J_C|$ becomes, the higher the flow rate of the mixed solvent contained in the ink 50. Therefore, the solute moving depending on the flow of the mixed solvent is larger in amount than that moving upon diffusing. Accordingly, the solute as a whole moves slightly to the peripheral part 50b.

Figure 10:
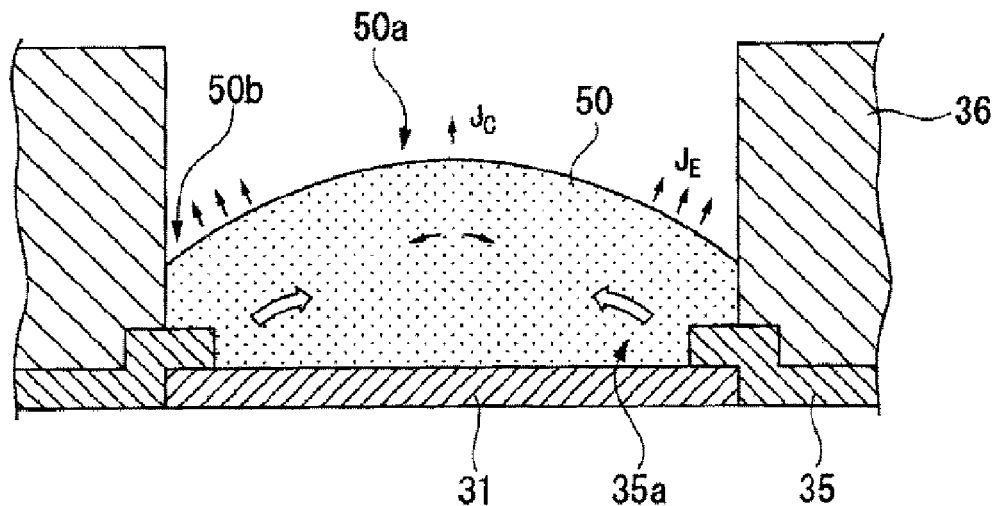
FIG. 10 is a view illustrating another manufacturing step similar to FIG. 6.

Next, exhaustion is stopped, and inert gas such as nitrogen gas or argon gas is supplied around the ink 50, and the pressure surrounding the ink 50 is increased (pressurizing step). The time t2 of the pressurizing step is about 120 seconds. By thus increasing the pressure surrounding the ink 50, the evaporation of the mixed solvent from the 50 is suppressed, as shown in FIG. 10. As compared with the case of the first depressurizing step, the evaporation amount of the mixed solvent decreases both in the central part 50a and peripheral part 50b of the ink 50. Therefore, the value $|J_E-J_C|$ becomes smaller than the value in the first depressurizing step. When thus the value $|J_E-J_C|$ becomes smaller, the flow rate of the mixed solvent in the ink 50 becomes lower. Therefore, the solute moving upon diffusing is larger in amount than the solute moving depending on the flow of the mixed solvent. Accordingly, the solute contained in the ink 50 diffuses in the entire ink 50.

After that, air around the ink 50 is exhausted at a second depressurizing speed, specifically to about 10 Pa in the course of an exhaustion time t2 (t2 is, for instance, 50 seconds), thereby reducing the pressure around the ink 50 (second depressurizing step). By thus reducing the pressure surrounding the ink 50, the mixed solvent is evaporated from the ink 50 again.

Figure 11:
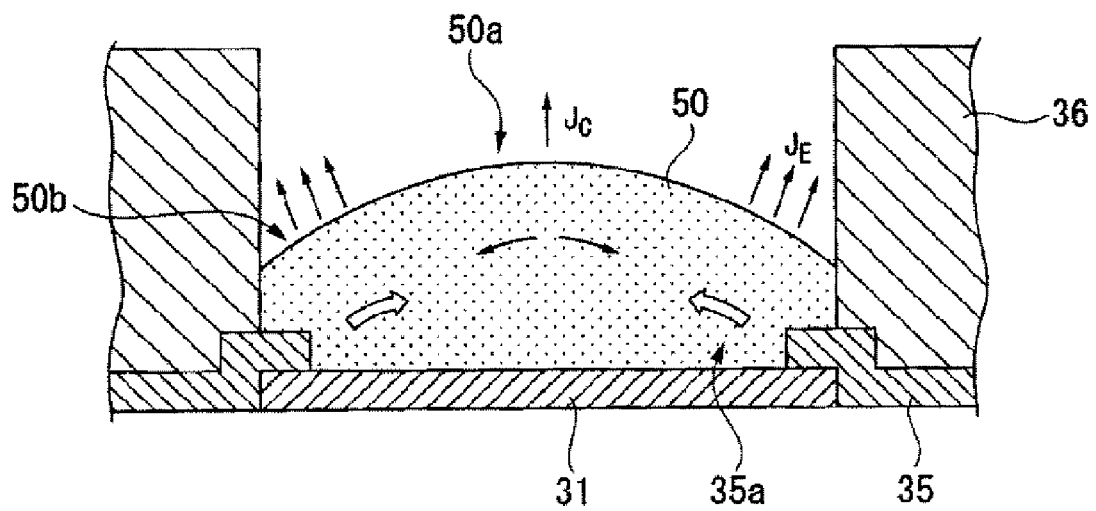
FIG. 11 is a view illustrating another manufacturing step similar to FIG. 6.

As compared with the case of the pressurizing step, as shown in FIG. 11, in the second depressurizing step, the amount of the mixed solvent evaporating from the central part 50a and the peripheral part 50b of the ink 50 becomes larger. Accordingly, the value of $J_C$ and $J_E$ become larger. On the other hand, as compared with the case of the first depressurizing step, in the second depressurizing step, the amount of the mixed solvent contained in the ink 50 becomes smaller. As a result, the value $J_C$ and $J_E$ also become smaller.

Though the value $|J_E-J_C|$ in the second depressurizing step thus becomes larger than that in the pressurizing step but is smaller than in the case of the first depressurizing step, and the flow rate of the mixed solvent in the ink 50 becomes hardly higher. Therefore, in the second depressurizing step, the amount of the solute moving upon diffusing becomes larger than or becomes almost equal to that of the solute moving depending on the flow of the mixed solvent. As a result, there occurs almost no movement of the solute depending on the flow of the mixed solvent. In the state in which the concentration distribution of the solute in the ink 50 is thus kept constant, the mixed solvent is made to evaporate from the ink 50, thereby forming the hole injection layer 32.

Figure 12:
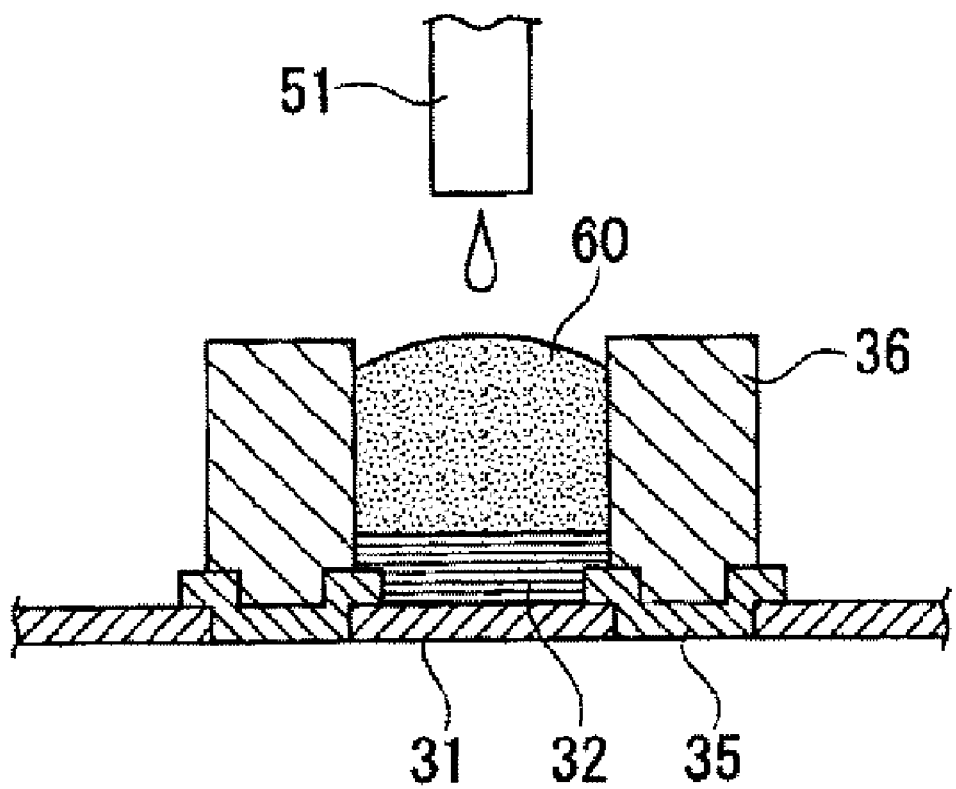
FIG. 12 is a view illustrating another manufacturing step similar to FIG. 6.

Next, the step for forming the light emitting layer 33 will be described. In this step, there is used ink 60 obtained by, for example, dissolving the above-mentioned light emitting materials into mixed solvent in which solvent other than the solvent used for the hole injection layer 32 is added. As shown in FIG. 12, the ink 60 is discharged from the nozzle 51 between the partitions 36. After the ink 60 is discharged, the drying step is carried out in the same manner as in the case of forming the hole injection layer 32.

To be more specific, first, air around the ink 60 is exhausted to thereby perform depressurization, and a part of the mixed solvent contained in the ink 60 is made to evaporate (first depressurizing step). After that, the pressure surrounding the ink 60 is increased, thereby allowing the solute to diffuse in the 60 (pressurizing step). Next, the pressure surrounding the ink 60 is reduced again, thereby allowing the remaining mixed solvent to evaporate (second depressurizing step). In this way, the light emitting layer 33 is formed.

After the formation of the light emitting layer 33, a further film is formed from calcium and further from aluminum by, for instance, a deposition method such as physical vapor deposition method, thereby forming the cathode 34. The cathode 34 is so formed that the cathode 34 covers light emitting layer 33, the upper surface 36e of the partition 36, and a part of the wall surface 36c of the partition 36, and is connected to the above-mentioned connecting wiring 27. In the case of forming a cathode protection layer on the cathode 34, for example, a silicon nitride film is formed on the cathode 34 by physical vapor deposition method such as ion plating method. In this way, the organic EL element 3 is formed.

When the base 10 and the organic EL element 3 are formed, the almost entire base 10 and organic EL element 3 are can-sealed by the sealing member 5, thereby completing the organic EL device 1.

As described above, according to this embodiment, by increasing the pressure surrounding the ink 50 in the pressurizing step, the evaporation speed of the mixed solvent contained in the ink 50 is decreased, thereby making it possible to reduce the evaporation amount ($J_E$) of the solvent from the central part 50a of the ink 50 and the evaporation amount ($J_C$) of the solvent from the peripheral part 50b of the ink 50. Accordingly, the absolute value of difference $|J_E-J_C|$ between $J_E$ and $J_C$ becomes smaller. Therefore, it becomes possible to reduce the flow rate of the mixed solvent flowing from the central part 50a towards the peripheral part 50b inside the ink 50. By thus reducing the flow rate of the mixed solvent, the solute diffuses inside the ink 50, thereby making it possible to keep the concentration of the solute constant both in the central part 50a and the peripheral part 50b of the ink 50.

Second Embodiment

Next, a second embodiment of the invention will be described. As in the case of the first embodiment, in the following, the scale of the figures to which reference is made is changed as appropriate so that each part is large enough to be recognized. Further, the same reference symbols are provided to the same components as those of the first embodiment of the invention and the description thereof will be omitted. It should be noted that the entire construction of the organic EL device according to this embodiment is substantially the same as the entire construction of the organic EL device 1 according to the first embodiment of the invention. Therefore, the description thereof will be omitted.

According to the first embodiment of the invention, inert gas (nitrogen gas or argon gas) is used as gas supplied around the ink 50 (60) in the pressurizing step. According to this embodiment, the vapor of the mixed solvent contained in the ink 50 (60) is supplied around the ink 50 (60).

Figure 13:
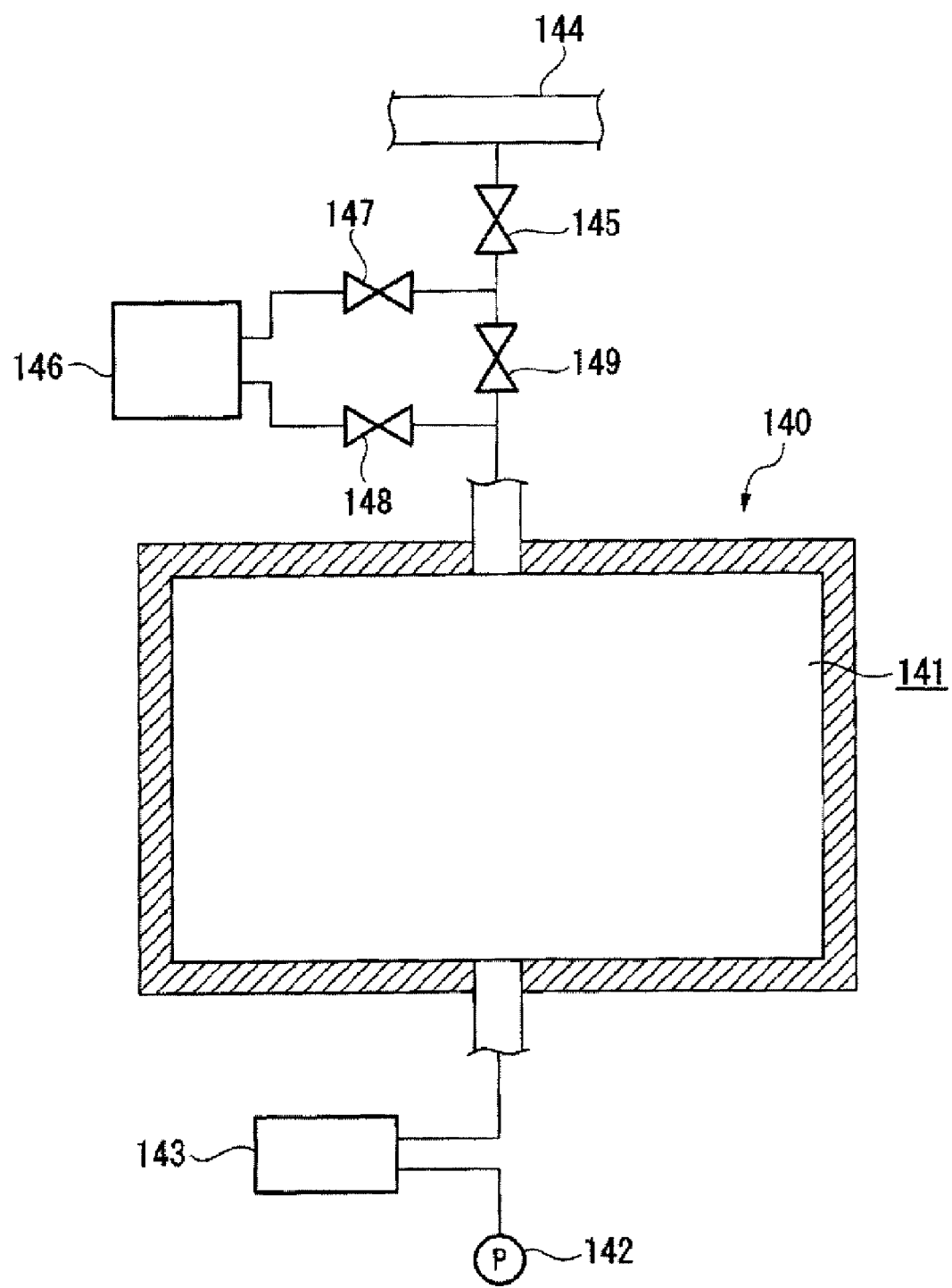
FIG. 13 is a view showing the construction of the drying apparatus according to a second aspect of the invention.

FIG. 13 is a view schematically showing the vapor supplying system that supplies the vapor of the mixed solvent to the inside of the treatment room.

As shown in FIG. 13, the vapor supplying system 140 includes an airtight treatment room 141, an exhaust apparatus (for example, pump) 142 that reduces the pressure in the treatment room 141, a trap 143 that adjusts the conduction of the exhaust air of the treatment room 141, and a gas supply source 144 that supplies inert gas such as nitrogen gas into the treatment room 141, a valve 145 that adjusts a flow rate of gas supplied to the treatment room 141, a tank 146 that serves as a supply source of the vapor of the mixed solvent, and valves 147, 148 and 149 that adjust the flow amount of the inert gas supplied from the gas supply source 144, the flow amount of the vapor of the mixed solvent supplied from the tank 146, or the like. In the tank 146, there is reserved the mixed solvent in a liquid state to be supplied to the treatment room 141 as gas by evaporation means (not shown).

By using the vapor supplying system 140 constructed as described above, the vapor of the mixed solvent is supplied when the pressurizing step is carried out, thereby making it possible to prevent the ink 50 (60) from deteriorating. Further, the ambient atmosphere of the ink 50 (60) serves as atmosphere for the mixed solvent. Therefore, it is ensured that the evaporation of the mixed solvent is reduced.

Electronic Apparatus

Next, the electronic apparatus according to the invention will be described by using a cellular phone as an example.

Figure 14:
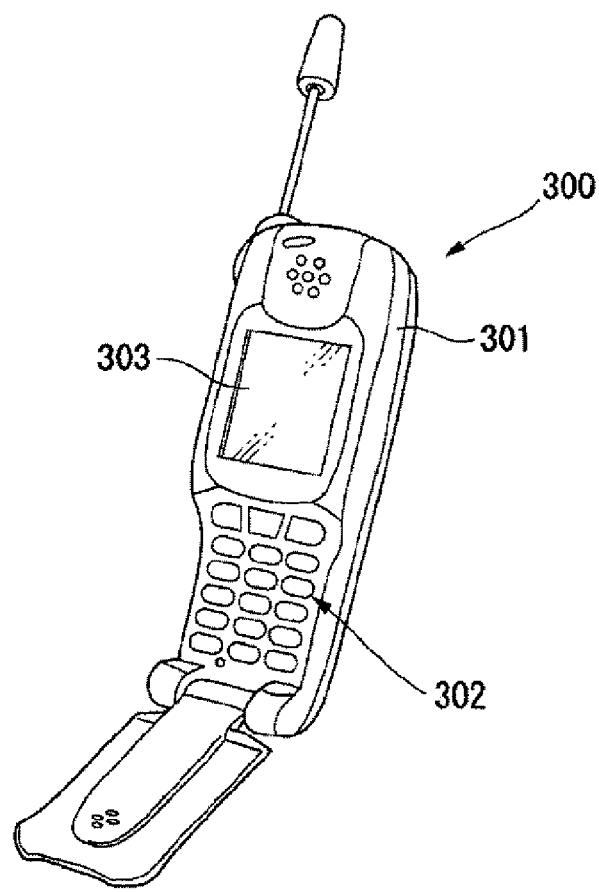
FIG. 14 is a view showing the construction of an electronic apparatus according to the invention.
Figure 15:
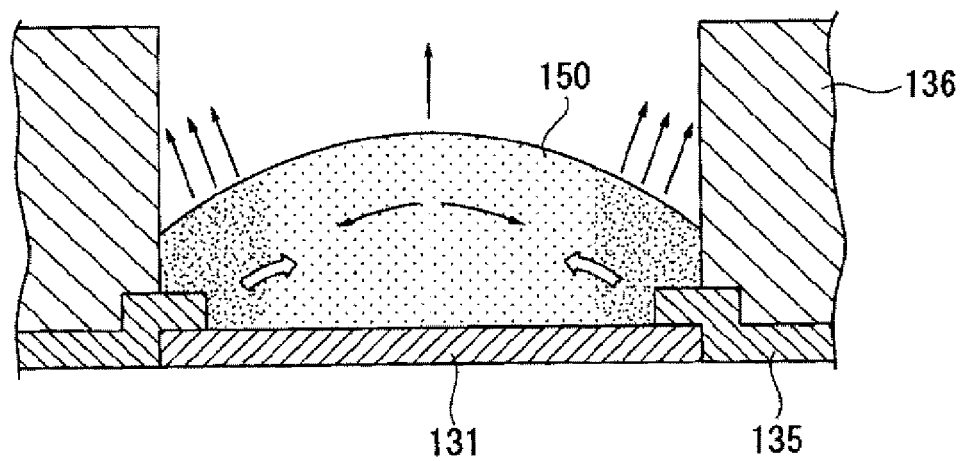
FIG. 15 is a view illustrating how ink evaporates.
Figure 16:
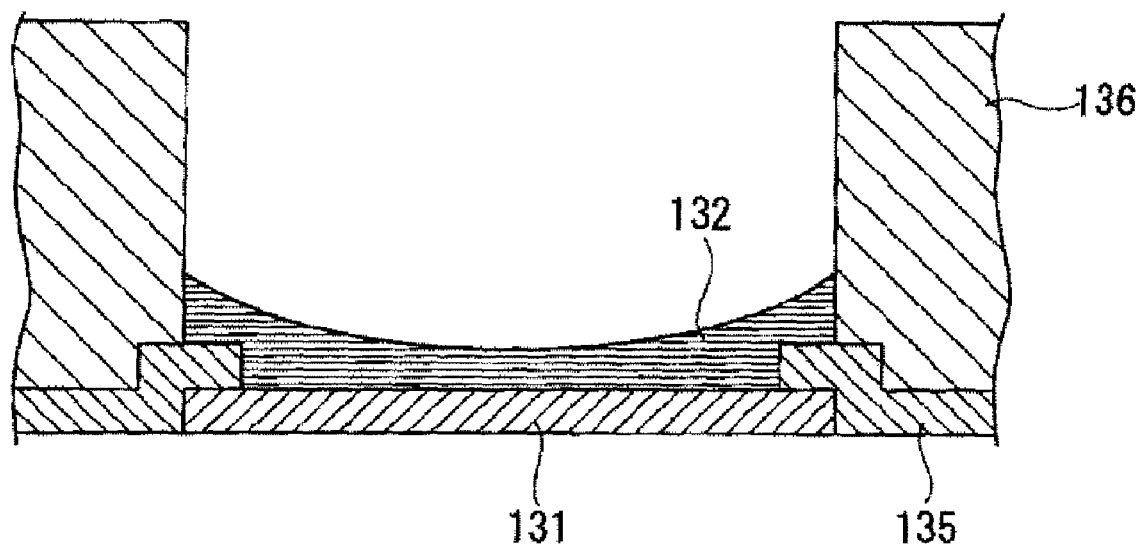
FIG. 16 is a view showing a film thickness of a film formed by drying ink.

FIG. 14 is a perspective view showing the entire construction of the cellular phone 300.

The cellular phone 300 has a casing 301, an operation part 302 on which a plurality of operating buttons are provided, a display part 303 that displays images, moving images, characters or the like. The organic EL device 1 according to this embodiment is incorporated into the display part 303.

The organic EL device 1 in which no chrominance non-uniformity exists is thus incorporated, so an electronic apparatus capable of realizing a comfortable display can be obtained.

It should be noted that the technical scope of the present invention is not limited to the above-mentioned embodiments and should be appropriately modified without departing from the gist of the present invention.

For example, in the above-mentioned embodiments, the case of forming the hole injection layer 32 and the light emitting layer 33 of the organic EL device 1 has been described as an example. However, the present invention is not limited thereto. The scope of the present invention is also applicable to, for example, the case of forming a film such as a color filter provided on a liquid crystal display device.

Furthermore, in the above-mentioned embodiments, the organic EL device 1 of bottom emission type has been described as an example. However, the present invention is not limited thereto. It goes without saying that the invention can be applied to an organic EL device of top emission type. In this case, it is not necessary to use transparent materials as the materials constituting the substrate 2, while it is necessary to use transparent materials as the materials constituting the sealing member 5.

Moreover, apart from the organic EL device, the invention is also applicable to the case in which film for a liquid crystal device, a Plasma Display Device (PDP), a Surface-conduction Electron-emitter Display (SED) or the like is formed.

Further, in the above embodiments, the case of forming the hole injection layer 32 and the light emitting layer 33 by an ink jet method has been described as an example. However, the present invention is not limited thereto. It goes without saying that the present invention can also be applied to the case in which, for example, a dip method, a spin coat method, or a spray coat method is employed.

What is claimed is:

1. A film forming method for forming a film including arranging a liquid composition on a substrate and drying the liquid composition, the liquid composition being obtained by dissolving a functional material in a solvent with a plurality of species of liquid mixed therein, the method comprising:

a) firstly reducing a pressure surrounding the liquid composition arranged on the substrate to a first pressure level;
   b) increasing the pressure surrounding the liquid composition to a predetermined second pressure level, after the step a); and
   c) secondly reducing the pressure surrounding the liquid composition after the step b) to a third pressure level,
   wherein the third pressure level of the step c) is lower than the first pressure level of the step a).

2. The film forming method according to claim 1, wherein the step b) further includes supplying inert gas around the liquid composition.

3. The film forming method according to claim 1, wherein the step b) further includes supplying vapor of the solvent around the liquid composition.

4. The film forming method according to claim 1, further comprising applying the liquid composition by an ink jet method.

5. A method for manufacturing an organic electroluminescent device having a charge transport layer and a light emitting layer, comprising:

forming at least one of the charge transport layer and the light emitting layer by the film forming method according to claim 1.

6. A film forming method for forming a film including arranging a liquid composition on a substrate and drying the liquid composition, the liquid composition being obtained by dissolving a functional material in a solvent with a plurality of species of liquid mixed therein, the method comprising:

a) firstly reducing a pressure surrounding the liquid composition arranged on the substrate at a first depressurizing speed;
   b) increasing the pressure surrounding the liquid composition to a predetermined pressure, after the step a); and
   c) secondly reducing the pressure surrounding the liquid composition at a second depressurizing speed, after the step b),
   wherein the first depressurizing speed is less than the second depressurizing speed.

7. The film forming method according to claim 6, wherein step a) occurs over a period of time that is greater than a period of time over which step c) occurs.

8. The film forming method according to claim 6, wherein the first depressurizing step occurs over 180 seconds and the second depressurizing step occurs over 50 seconds.

9. The film forming method according to claim 6, wherein the step b) further includes supplying inert gas around the liquid composition.

10. The film forming method according to claim 6, wherein the step b) further includes supplying vapor of the solvent around the liquid composition.

11. The film forming method according to claim 6, further comprising applying the liquid composition by an ink jet method.

12. A method for manufacturing an organic electroluminescent device having a charge transport layer and a light emitting layer, comprising:

forming at least one of the charge transport layer and the light emitting layer by the film forming method according to claim 6.

\* \* \* \* \*